United States Patent [12]
Zhou et al.

(10) Patent No.: US 11,469,257 B2
(45) Date of Patent: Oct. 11, 2022

(54) DISPLAY PANEL AND DISPLAY DEVICE

(71) Applicant: Wuhan Tianma Micro-Electronics Co., Ltd., Wuhan (CN)

(72) Inventors: Xiufeng Zhou, Wuhan (CN); Huangyao Wu, Xiamen (CN); Hongbo Zhou, Xiamen (CN); Zhiqiang Xia, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 149 days.

(21) Appl. No.: 17/007,753

(22) Filed: Aug. 31, 2020

(65) Prior Publication Data

US 2021/0408057 A1 Dec. 30, 2021

(30) Foreign Application Priority Data

Jun. 30, 2020 (CN) .......................... 202010623016.3

(51) Int. Cl.
*G09G 1/08* (2006.01)
*H01L 27/12* (2006.01)
*G09G 3/00* (2006.01)
*G09G 3/3208* (2016.01)
*H01L 23/00* (2006.01)
*H05K 1/18* (2006.01)

(52) U.S. Cl.
CPC .......... *H01L 27/124* (2013.01); *G09G 3/006* (2013.01); *G09G 3/3208* (2013.01); *H01L 23/562* (2013.01); *H05K 1/189* (2013.01); *G09G 2310/0264* (2013.01); *G09G 2330/12* (2013.01); *H05K 2201/10128* (2013.01)

(58) Field of Classification Search
CPC ..... H01L 27/124; H01L 23/562; H01L 27/32; G09G 3/006; G09G 3/3208; G09G 2310/0264; G09G 2330/12; G09G 2300/0426; G09G 2310/0297; H05K 1/189; H05K 2201/10128
USPC ....................... 345/8, 15, 33, 55, 84; 349/48
See application file for complete search history.

(56) References Cited

U.S. PATENT DOCUMENTS 10,748,981 B1 * 8/2020 Rieutort-Louis .... G09G 3/3225
2009/0174836 A1 * 7/2009 Yoo ................... G02F 1/134336
349/48

(Continued)

FOREIGN PATENT DOCUMENTS

CN 207624701 U 7/2018
CN 108807476 A 11/2018

*Primary Examiner* — Thuy N Pardo
(74) *Attorney, Agent, or Firm* — von Briesen & Roper, s.c.

(57) ABSTRACT

Disclosed are a display panel and a display device. The display panel includes a display area, a wiring area, and a bending area connecting the display area and the wiring area; the bending area includes a first boundary on a side closer to the display area; in the first direction, an extension length of the first boundary is less than an extension length of the wiring area; in the second direction, a vertical projection of the first boundary in the wiring area is located within the coverage of the wiring area; in the second direction, the display area includes sub-pixel rows, and the last sub-pixel row is located on a side of the display area closer to the wiring area; in the first direction, a first sub-pixel in the last sub-pixel row is located on a side of the wiring area boundary closer to the center of the display panel.

16 Claims, 10 Drawing Sheets

(56) References Cited

U.S. PATENT DOCUMENTS

| | | | | |
|---|---|---|---|---|
| 2014/0028534 A1* | 1/2014 | Park | ............................ | G09G 3/20 |
| | | | | 345/84 |
| 2018/0108721 A1* | 4/2018 | Lee | ........................ | G09G 3/3233 |
| 2018/0123060 A1* | 5/2018 | Jang | ........................ | H01L 27/124 |
| 2019/0043414 A1* | 2/2019 | Wu | ............................ | G09G 3/20 |
| 2019/0081127 A1* | 3/2019 | Shim | ..................... | G09G 3/3291 |
| 2019/0302919 A1* | 10/2019 | Clark | ........................ | G06F 3/044 |
| 2019/0355794 A1* | 11/2019 | Dai | ..................... | H01L 27/3218 |
| 2019/0363117 A1* | 11/2019 | Li | ........................ | H01L 27/3262 |
| 2019/0392743 A1* | 12/2019 | Lee | ........................ | G09G 3/006 |
| 2020/0004296 A1* | 1/2020 | Lee | ........................ | G06F 1/1641 |
| 2020/0135098 A1* | 4/2020 | Tan | ..................... | G09G 3/2003 |
| 2020/0176537 A1* | 6/2020 | Son | ........................ | H01L 27/3267 |
| 2020/0176544 A1* | 6/2020 | Bae | ........................ | G09G 3/3225 |
| 2020/0296843 A1* | 9/2020 | Gao | ........................ | G09G 3/03 |
| 2021/0065625 A1* | 3/2021 | Wang | ................... | G09G 3/3233 |

\* cited by examiner

DISPLAY PANEL AND DISPLAY DEVICE

CROSS-REFERENCE TO RELATED APPLICATIONS

This application claims priority to Chinese patent application No. CN202010623016.3 filed with CNIPA on Jun. 30, 2020, the disclosure of which is incorporated herein by reference in its entirety.

TECHNICAL FIELD

The embodiments of the present disclosure relate to the field of display technologies and, particularly, to a display panel and a display device.

BACKGROUND

With the development of display technologies, the application of the display technologies has become more and more extensive. Organic Light-Emitting Diode (OLED) displays have the advantages of self-luminescence, fast response, wide view angle, high brightness, bright colors, lightness and thinness. Therefore, OLED displays are widely used.

Furthermore, with the diversification of the application fields of OLED display technologies, there are diversified requirements for the appearance of display panels, and special-shaped display panels have appeared. Compared with the conventional rectangular display panel, the main difference of the special-shaped display panel is that its display area presents a special non-rectangular shape, for example, the corner is a rounded corner. The existing panel design can no longer meet the design needs of a large rounded corner, so how to improve the rounded corner of the display panel has become a research hotspot.

SUMMARY

In view of this, embodiments of the present disclosure provide a display panel and a display device.

In one aspect, an embodiment of the present disclosure provides a display panel, including a display area, a wiring area, and a bending area connecting the display area and the wiring area.

The bending area includes a first boundary closer to the display area.

In a first direction, an extension length of the first boundary is smaller than an extension length of the wiring area; and the first direction intersects a direction from the display area to the bending area.

In a second direction, a vertical projection of the first boundary on the wiring area is located within coverage of the wiring area; and the second direction is parallel to the direction from the display area to the bending area.

In the second direction, the display area includes multiple sub-pixel rows, and a last sub-pixel row of the sub-pixel rows is located on a side of the display area closer to the wiring area; in the first direction, a first sub-pixel in the last sub-pixel row is located on a side of a wiring area boundary closer to a center of the display panel.

In another aspect, an embodiment of the present disclosure further provides a display device including the display panel described in the first aspect.

BRIEF DESCRIPTION OF DRAWINGS

In order to describe the exemplary embodiments of the present disclosure more clearly, the drawings needed to describe the embodiments are briefly introduced in the following. Obviously, the drawings described are only the drawings of a part of the embodiments to be described in the present disclosure, rather than all the drawings. For those of ordinary skill in the art, without creative work, other drawings can be obtained from these drawings.

DETAILED DESCRIPTION

In order to make the objectives, technical schemes and advantages of the present disclosure clearer, the technical schemes of the present disclosure will be described in detail through specific implementation manners in conjunction with the drawings in the embodiments of the present disclosure. Apparently, the described embodiments are a part of the embodiments of the present disclosure, but not all the embodiments. Based on the embodiments of the present disclosure, all other embodiments obtained by those of ordinary skill in the art without creative efforts, all fall within the protection scope of the present disclosure.

Figure 1:
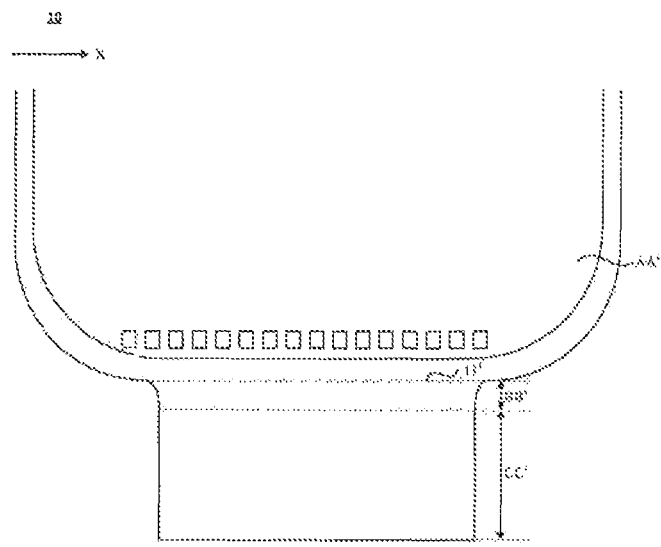
FIG. 1 is a structure diagram of a display panel in the related art.

FIG. 1 is a structure diagram of a display panel in the related art. As shown in FIG. 1, the display panel 10 includes a display area AA', a wiring area CC', and a bending area BB' connecting the display area AA' and the wiring area CC'; the bending area BB' includes a first boundary 11' on one side closer to the display area AA'; in the first direction (the direction X as shown in the figure), an extension length of the first boundary 11 is equal to an extension length of the wiring area CC'; and a first sub-pixel in the last sub-pixel row is located on a side of the wiring area boundary facing away from a center of the display panel. Therefore, it is difficult to further increase the rounded corner in the display panel provided in the related art.

An embodiment of the present disclosure provides a display panel, including a display area, a wiring area, and a bending area connecting the display area and the wiring area; the bending area includes a first boundary on a side closer to the display area; in the first direction, an extension length of the first boundary is less than an extension length of the wiring area; the first direction intersects a direction from the display area to the bending area; in the second direction, a vertical projection of the first boundary in the wiring area is located within the coverage of the wiring area; the second direction is parallel to the direction from the display area to the bending area; in the second direction, the display area includes multiple sub-pixel rows, and the last sub-pixel row is located on a side of the display area closer to the wiring area; in the first direction, a first sub-pixel in the last sub-pixel row is located on a side of the wiring area boundary closer to the center of the display panel. By reasonably setting an extension length of the first boundary of the bending area closer to one side of the display area and a position of the first sub-pixel in the last sub-pixel row, it is ensured that the display area achieves a larger rounded corner display; based on the larger rounded corner, the design requirement of four-side bending is further realized.

The above is the core idea of the present disclosure. The technical schemes in the embodiments of the present disclosure will be described clearly and completely in conjunction with the drawings in the embodiments of the present disclosure. Based on embodiment of the present disclosure, all the other embodiments got by the technical personnel in this field on the premise of not paying creative labor, are in the scope of the protection of the present disclosure.

Figure 2:
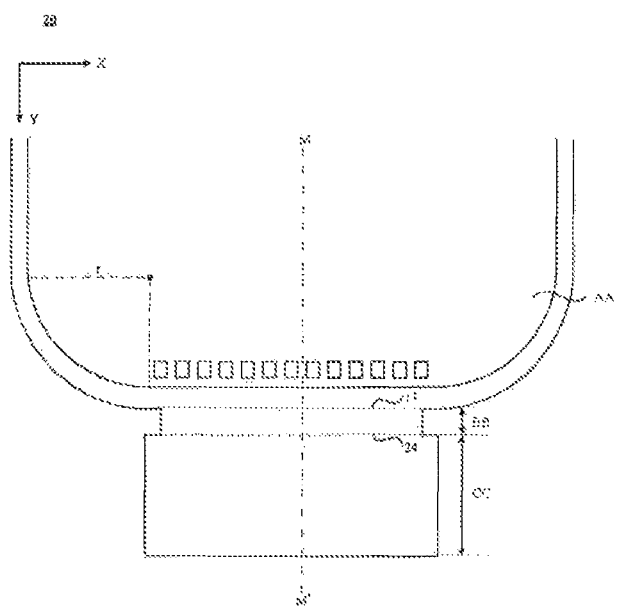
FIG. 2 is a structure diagram of a display panel according to an embodiment of the present disclosure.

FIG. 2 is a structure diagram of a display panel provided by an embodiment of the present disclosure. As shown in FIG. 2, the display panel 20 includes a display area AA, a wiring area CC, and a bending area BB connecting the display area AA and the wiring area CC; the bending area BB includes a first boundary 11 closer to a side of the display area; in a first direction (the direction X as shown in the figure), an extension length of the first boundary 11 is less than an extension length of the wiring area CC; the first direction intersects a direction from the display area AA to the bending area BB; in the second direction (the direction Y as shown in the figure), the vertical projection of the first boundary 11 in the wiring area CC is located within the coverage of the wiring area CC; the second direction is parallel to the direction from the display area AA to the bending area BB; in the second direction, the display area AA includes multiple sub-pixel rows, and the last sub-pixel row is located on a side of the display area AA closer to the wiring area CC; in the first direction, a first sub-pixel in the last sub-pixel row is located on a side of a boundary of the wiring area CC closer to the center M-M' of the display panel.

Exemplarily, as shown in FIG. 2, in the first direction, an extension length of the first boundary 11 is smaller than an extension length of the wiring area CC; and in the second direction, a vertical projection of the first boundary 11 in the wiring area CC is located within the coverage of the wiring area CC. Compared to the related art shown in FIG. 1, an extension length of the first boundary 11 of the bending area BB closer to the display area AA is smaller, it is convenient to realize a larger rounded corner at two connecting corners on a side of the display area AA closer to the bending area BB. Furthermore, by reasonably setting the first sub-pixel in the last sub-pixel row to be located on a side of the wiring area CC boundary closer to the center M-M' of the display panel, and at the same time setting the last sub-pixel in the last sub-pixel row to be located on a side of the wiring area CC boundary closer to the center M-M' of the display panel, and sufficient space is reserved for the two connecting corners of the display area AA closer to the bending area BB to achieve a larger rounded corner.

Furthermore, since the wiring area CC needs to be provided with an integrated driving chip and a flexible circuit board (not shown), the flexible circuit board is provided with multiple binding terminals. In the related art, it is difficult to compress the size of the binding terminal and the distance between two adjacent binding terminals. Therefore, in the first direction X, the size of the flexible circuit board is difficult to further compress, and correspondingly, the extended length of the wiring area CC is difficult to further compress. Therefore, in the embodiment of the present disclosure, the extension length of the first boundary 11 is set to be smaller than the extension length of the wiring area CC, and a larger rounded corner of the display area AA is achieved by only compressing the first boundary 11 of the bending area BB closer to the display area AA. It is ensured that the wiring area CC and the flexible circuit board are simple to set.

Furthermore, for a display panel that needs to be curved on four sides, by compressing the first boundary 11 of the bending area BB closer to the display area AA, and reasonably setting the positions of the first and last sub-pixels in the last sub-pixel row, the four-side curved design of the display panel can be realized while ensuring a larger rounded corner.

In summary, in the display panel provided by the embodiment of the present disclosure, by reasonably setting the extension length of the first boundary of the bending area closer to the display area and the positions of the first sub-pixel and the last sub-pixel in the last sub-pixel row, it is ensured to achieve display of the display area with a larger rounded corner. At the same time, based on a larger rounded corner, the design requirements of four-side bending are further realized.

Figure 3:
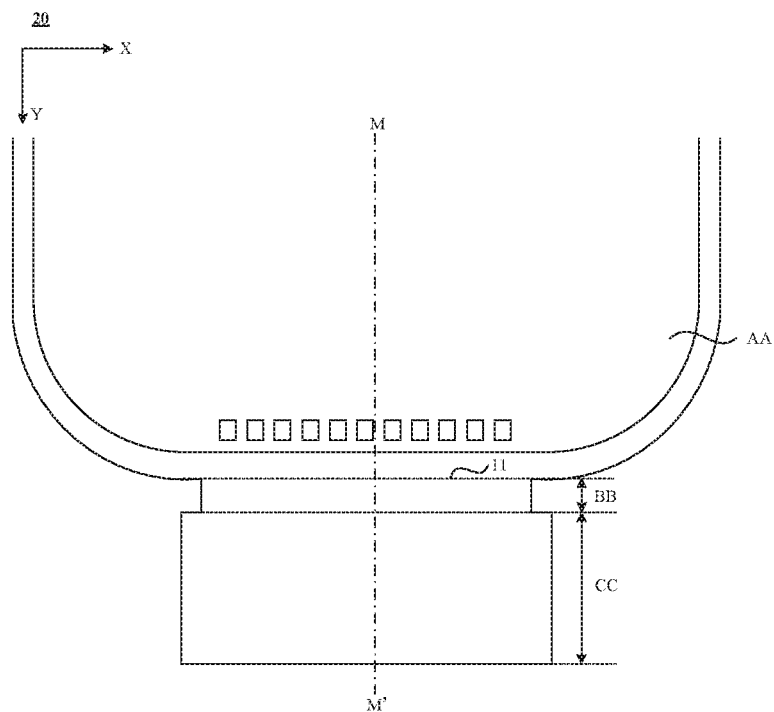
FIG. 3 is a structure diagram of another display panel according to an embodiment of the present disclosure.

On the basis of the above embodiment, FIG. 3 is a structure diagram of another display panel provided by an embodiment of the present disclosure. As shown in combination with FIG. 2 and FIG. 3, in the first direction, i.e., the direction X as shown in the figure, the first sub-pixel in the last sub-pixel row is located on a side of the wiring area CC boundary closer to the center M-M' of the display panel. It can be that the first sub-pixel in the last sub-pixel row is located on a side of the bending area BB boundary closer to the center M-M' of the display panel, as shown in FIG. 3; still in the first direction, the first sub-pixel in the last sub-pixel row is located on the side of the wiring area CC boundary closer to the center M-M' of the display panel, and is located on a side of the bending area BB boundary facing away from the center M-M' of the display panel, as shown in FIG. 2. The embodiment of the present disclosure does not limit the specific position of the first sub-pixel in the last sub-pixel row, and only needs to ensure that the first sub-pixel in the last sub-pixel row is located at a side of the wiring area CC boundary closer to the center M-M' of the display panel, and ensures that a larger rounded corner of the display panel is realized.

On the basis of the above embodiment, with continued reference to FIG. 2, the boundary of the display area AA includes at least one rounded corner closer to the bending area BB; the radius r of the rounded corner satisfies r>5 mm.

Exemplarily, FIG. 2 illustrates an example in which the boundary of the display area AA includes two connecting corners both of which are R-corners closer to the bending area BB. As shown in FIG. 2, the radius r of the rounded corner satisfies r>5 mm, for example, r=6 mm, 8 mm or 10 mm. The embodiment of the present disclosure does not limit the specific value of the rounded corner radius, and only needs to ensure a larger rounded corner.

Figure 4:
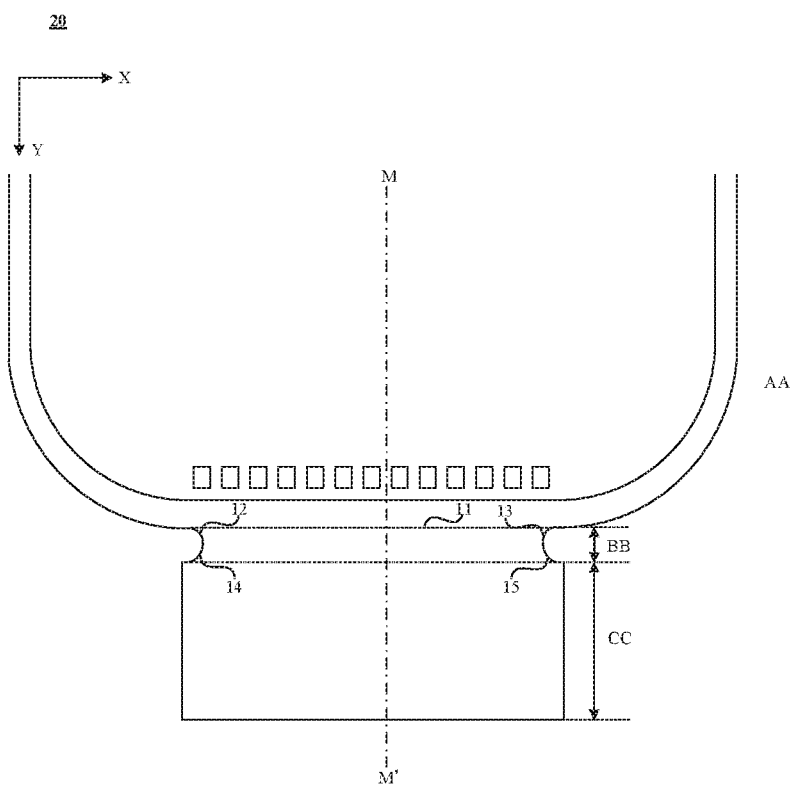
FIG. 4 is a structure diagram of another display panel according to an embodiment of the present disclosure.

As a feasible implementation, FIG. 4 is a structure diagram of another display panel provided by an embodiment of the present disclosure. As shown in FIG. 4, the bending area BB includes at least a first connecting corner 12 and a second connecting corner 13 which connect the display area AA and the bending area BB, and a third connecting corner 14 and a fourth connecting corner 15 which connect the bending area BB and the wiring area CC; at least one of the first connecting corner 12, the second connecting corner 13, the third connecting corner 14, and the fourth connecting corner 15 is an arc-shaped corner.

Exemplarily, FIG. 4 illustrates an example in which all of the first connecting corner 12, the second connecting corner 13, the third connecting corner 14 and the fourth connecting corner 15 are curved corners. As shown in FIG. 4, at least one of the first connecting corner 12, the second connecting corner 13, the third connecting corner 14, and the fourth connecting corner 15 is set to be an arc-shaped corner, which can address or alleviate the stress concentration of the bending area BB at the connecting corners, reduce the risk of damage to the bending area BB due to stress concentration when the connecting corners of the bending area BB are bent, and improve the performance of bending durability of the display panel.

Figure 5:
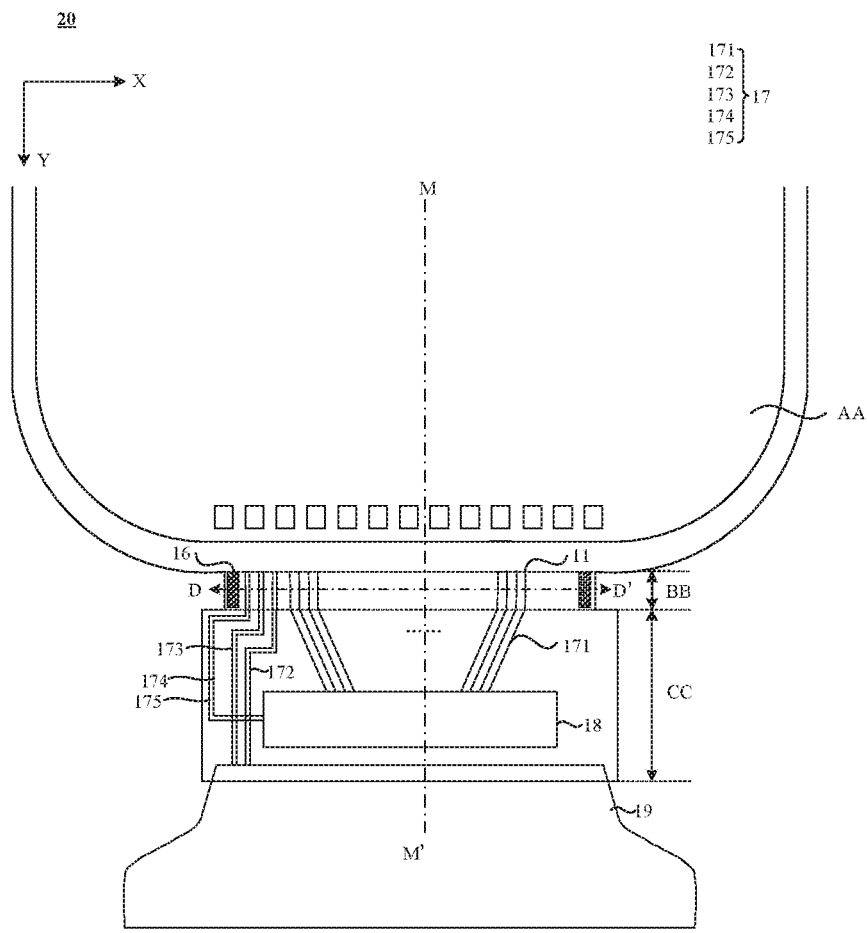
FIG. 5 is a structure diagram of another display panel according to an embodiment of the present disclosure.
Figure 6:
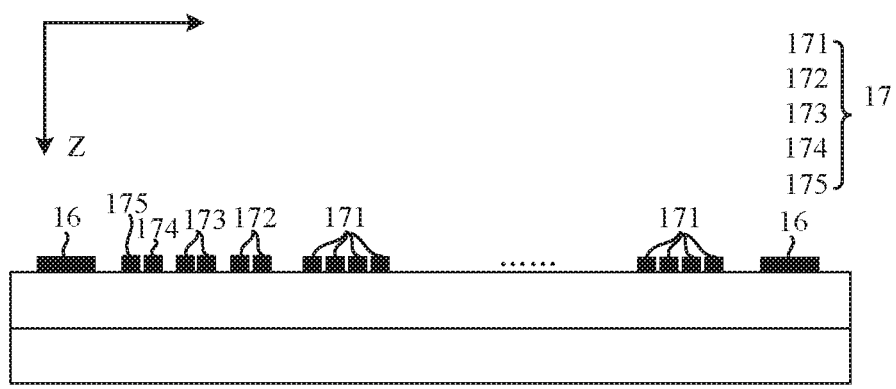
FIG. 6 is a cross-sectional structure diagram of the display panel provided in FIG. 5 along the section line D-D'.

As a feasible implementation, FIG. 5 is a structure diagram of another display panel provided by an embodiment of the present disclosure, and FIG. 6 is a cross-sectional structure diagram of the display panel provided in FIG. 5 in the section line D-D'. As shown in FIG. 5 and FIG. 6, the display panel 20 may also include at least one anti-tear structure 16. The anti-tear structure 16 is a metal mesh structure and the anti-tear structure 16 is arranged adjacent to the connecting corner of the bending area BB; the bending area BB is provided with multiple signal wires 17, and the anti-tear structure 16 and the signal wires 17 are arranged in a same layer.

Exemplarily, as shown in FIG. 5, since the bending stress and the lateral pulling force are concentrated at the connecting corners of the bending area BB, the anti-tear structure 16 is a metal mesh structure, the anti-tear structure 16 and the connecting corners of the bending area BB are adjacently arranged, and the anti-tear structure 16 can bear the bending stress and the lateral pulling force at the connecting corner of the bending area BB, reduce the risk of damage to the connecting corners of the bending area BB due to bending stress and lateral pulling force, and improve the performance of bending durability of the display panel.

Furthermore, as shown in FIG. 5, an extending direction of the metal mesh in the anti-tear structure 16 and the first direction (the direction X as shown in the figure) form a certain angle, such as 40°, 45° or 50°; and the embodiment of the present disclosure does not limit the specific angle value. By setting an extension direction of the metal mesh in the anti-tear structure 16 to be at a certain angle with the first direction, the resistance of the anti-tear structure 16 to bending stress and lateral pulling force can be enhanced, the risk of damage to the connecting corners of the bending area BB due to bending stress and lateral pulling force is reduced, and the performance of bending durability of the display panel is improved.

Furthermore, an integrated driving circuit 18 and a flexible circuit board 19 are also arranged in the wiring area CC, and the integrated driving circuit 18 and the flexible circuit board 19 are bonded and arranged at different positions in the wiring area CC. The multiple signal wires 17 may include a data signal wire 171, a high voltage power signal line 172, a low voltage power signal line 173, a high voltage scan control signal line 174 and a low voltage scan control signal line 175. Since there are multiple signal wires 17 in the bending area BB, the anti-tear structure 16 and the signal wires 17 are arranged in the same layer, for example, the anti-tear structure 16 and the signal wires 17 may both be arranged in a bending neutral surface of the bending area BB to reduce the bending stress received by the anti-tear structure 16 and the signal wire 17 during the bending process, and improve the performance of bending durability of the bending area BB. Furthermore, the arrangement of the anti-tear structure 16 and the signal wire 17 in the same layer can also ensure that the arrangement of a film layer of the bending area BB is simple, and the anti-tear structure 16 and the signal wire 17 are arranged in the same layer and may be formed in a same mask process through a same mask plate, so that the difficulty of the preparation process of the anti-tear structure 16 is reduced, and the preparation efficiency is improved.

Furthermore, the anti-tear structure 16 and the signal line 17 may both be arranged on the neutral surface of the bending area BB to reduce the stress received by the anti-tear structure 16 and the signal line 17 during the bending process, and improve the performance of bending durability of the anti-tear structure 16 and the signal line 17.

It should be noted that the signal wire 17 provided in the embodiment of the present disclosure may also include other wires, such as scan control clock signal wires. FIGS. 5 and 6 only illustrate several different types of signal wires that may exist in the form of examples, and other types of signal wires located in the bending area are also within the protection scope of the embodiments of the present disclosure.

It should be noted that FIG. 5 only illustrates that the integrated driving circuit and the flexible circuit board are both arranged on the substrate of the display panel, and it is understood that the integrated driving circuit may also be disposed on the flexible circuit board, and the flexible circuit board is arranged on the substrate of the display panel. The embodiment of the present disclosure does not limit the specific arrangement of the integrated driving circuit and the flexible circuit board.

Figure 7:
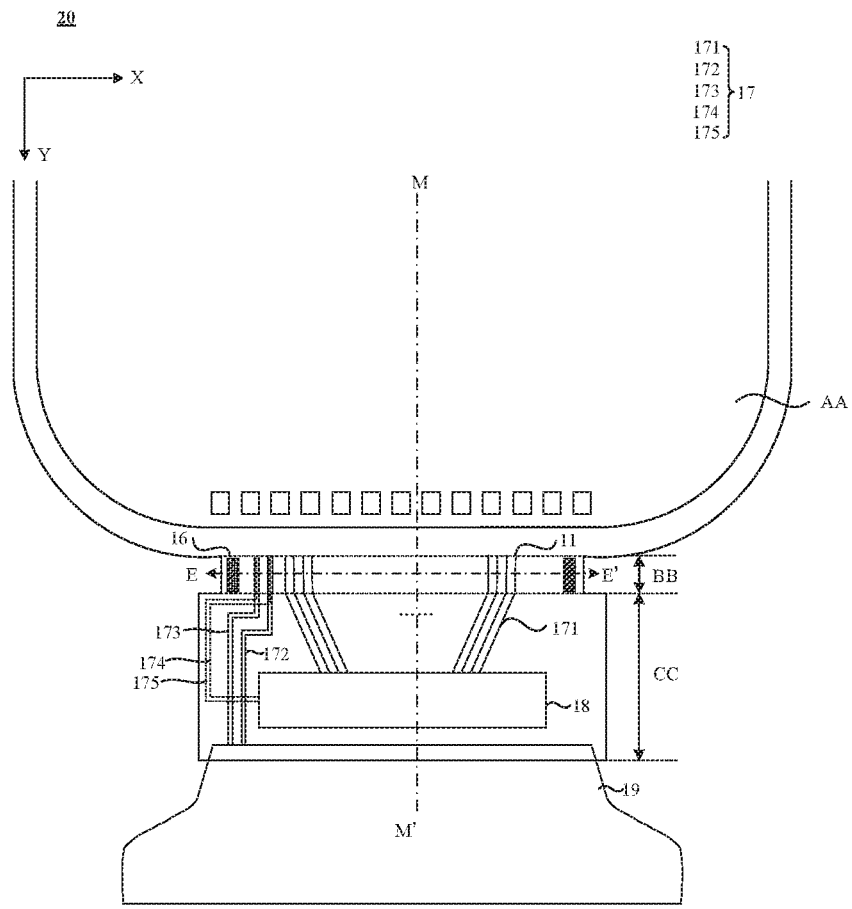
FIG. 7 is a structure diagram of another display panel according to an embodiment of the present disclosure.
Figure 8:
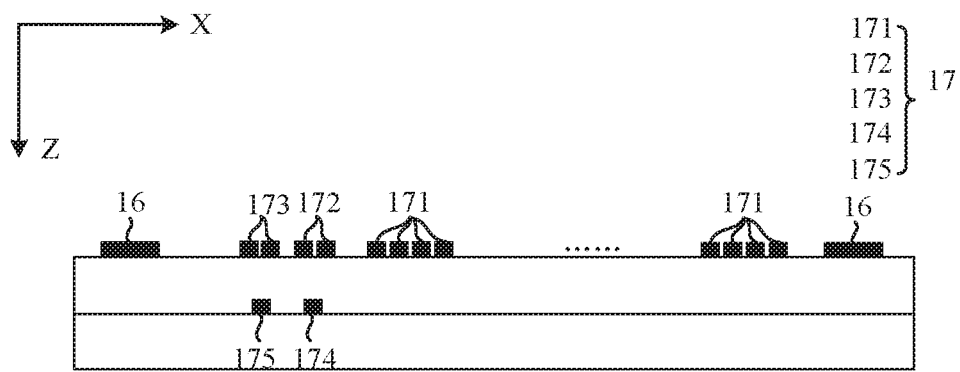
FIG. 8 is a cross-sectional structure diagram of the display panel provided in FIG. 7 along the section line E-E'.

As a feasible implementation manner, FIG. 7 is a structure diagram of another display panel provided by an embodiment of the present disclosure, and FIG. 8 is a schematic cross-sectional structure diagram of the display panel provided in FIG. 7 along the section line E-E. As shown in FIGS. 7 and 8, multiple signal wires 17 are provided in the bending area BB, and the multiple signal wires 17 include at least a high voltage power signal line 172, a low voltage power signal line 173, and a high voltage scan control signal line 174 and a low voltage scan control signal line 175; in a third direction (the direction Z as shown in the figure), the high voltage power signal line 172 and the high voltage scan control signal line 174 at least partially overlap, and the low voltage power signal line 173 and the low voltage scan control signal line 175 at least partially overlap; the third direction is perpendicular to the first direction and the second direction.

Furthermore, an integrated driving circuit 18 and a flexible circuit board 19 are also arranged in the wiring area CC, and the integrated driving circuit 18 and the flexible circuit board 19 are bonded and arranged at different positions of the wiring area CC. The multiple signal wires 17 may include a high voltage power signal line 172, a low voltage power signal line 173, a high voltage scan control signal line 174 and a low voltage scan control signal line 175. The high voltage power signal line 172 may be a PVDD signal line, one end of the high voltage power signal line 172 is electrically connected to the flexible circuit board 19, and the other end is electrically connected to the pixel circuit in the sub-pixel (not shown), and is used to provide a high voltage signal to a light-emitting element in the sub-pixel; the low voltage power signal line 173 may be a PVEE signal line, one end of the low voltage power signal line 173 is electrically connected to the flexible circuit board 19, and the other end is electrically connected to the light-emitting element in the sub-pixel (not shown), and is used to provide a low voltage signal to a light-emitting element in the sub-pixel; the high voltage scan control signal line 174 may be a VGH signal line, one end of the high voltage scan control signal line 174 is electrically connected to the integrated driving circuit 18, and the other end is electrically connected to the shift register circuit (not shown), and is used to calibrate the high potential in the scan signal or light-emitting control signal; and the low voltage scan control signal line 175 can be a VGL signal line, one end of the low voltage scan control signal line 175 is electrically connected to the integrated drive circuit 18, and the other end is electrically connected to the shift register circuit (not shown), and is used to calibrate the low potential in the scan signal or light-emitting control signal.

Furthermore, in the third direction (the direction Z as shown in the figure), the high voltage power signal line 172 and the high voltage scan control signal line 174 are arranged to at least partially overlap, and the high voltage power signal line 172 and the high voltage scan control signal line 174 that were originally laid out in a same horizontal direction are adjusted into a laminated arrangement to ensure that an extension length of the bending area BB in the first direction (the direction X as shown in the figure) can be reduced, and that sufficient space can be reserved for the larger rounded corner of the display area AA. Similarly, in the third direction (in the direction Z as shown in the figure), the low voltage power signal line 173 and the low voltage scan control signal line 175 are arranged to at least partially overlap, and the low voltage power signal line 173 and the low voltage scan control signal line 175 that were originally laid out in a same horizontal direction are adjusted into a laminated arrangement to ensure that an extension length of the bending area BB in the first direction (the direction X as shown in the figure) can be reduced, and that sufficient space can be reserved for the larger rounded corner of the display area AA.

Furthermore, since the signals transmitted in the high voltage power signal line 172 and the high voltage scanning control signal line 174 are both positive-level signals with a higher potential, the high voltage power signal line 172 and the high voltage scanning control signal line 174 are arranged to at least partially overlap, so that the parasitic capacitance between the high voltage power signal line 172 and the high voltage scan control signal line 174 is relatively small, which has less impact on the signals transmitted in the high voltage power signal line 172 and the high voltage scan control signal line 174; and the signals transmitted in the high voltage power signal line 172 and the high voltage scan control signal line 174 are both signals with a fixed potential, which can prevent signal leaps or abrupt changes from affecting other signals, ensure the normal transmission of different signals, and the normal display of the display panel. Similarly, since the signals transmitted in the low voltage power signal line 173 and the low voltage scan control signal line 175 are both negative-level signals with a lower potential or zero-potential signals, the low voltage power signal line 173 and the low voltage scan control signal line 175 are arranged to at least partially overlap, so that the parasitic capacitance between the low voltage power signal line 173 and the low voltage scan control signal line 175 is small, which has less impact on the signals transmitted in the low voltage power signal line 173 and the low voltage scan control signal line 175, and the signals transmitted in the low voltage power signal line 173 and the low voltage scan control signal line 175 are signals with a fixed potential, which can avoid signal leaps or abrupt changes from affecting other signals, and ensure the normal transmission of different signals and the normal display of the display panel.

It should be noted that, in the bending area BB, the high voltage power signal line 172 and the high voltage scan control signal line 174 at least partially overlap, and the low voltage power signal line 173 and the low voltage scan control signal line 175 at least partially overlap; in the wiring area CC, the arrangement of the high voltage power signal line 172 and the high voltage scanning control signal line 174, and the arrangement of the low voltage power signal line 173 and the low voltage scanning control signal line 175 are not limited in the embodiment of the present disclosure. As shown in FIGS. 7 and 8, in the wiring area CC, the high voltage power signal line 172 and the high voltage scan control signal line 174 at least partially overlap, and the low voltage power signal line 173 and the low voltage scan control signal line 175 at least partially overlap; or in the wiring area CC, the high voltage power signal line 172 and the high voltage scan control signal line 174 do not overlap, and the low voltage power signal line 173 and the low voltage scan control signal line 175 do not overlap (not shown). FIG. 7 illustrates an example in which, in the wiring area CC, the high voltage power signal line 172 and the high voltage scan control signal line 174 at least partially overlap, and the low voltage power signal line 173 and the low voltage scan control signal line 175 at least partially overlap, thus the high voltage scan control signal line 174 and the low voltage scan control signal line 175, which are located in the lower film layer, are only indicated by dotted lines.

It should also be noted that when the high voltage power signal line 172 and the high voltage scan control signal line 174 at least partially overlap, and the low voltage power signal line 173 and the low voltage scan control signal line 175 at least partially overlap, as to which part of the wires are located on the upper layer and which part of the wires are located on the lower layer, which is not limited in the embodiment of the present disclosure, and FIGS. 7 and 8 are only described in a feasible implementation manner.

It should also be noted that when the high voltage power signal line 172 and the high voltage scan control signal line 174 at least partially overlap, and the low voltage power signal line 173 and the low voltage scan control signal line 175 at least partially overlap, the anti-tear structure 16 can be arranged on the same layer as any type of signal wire 17, which is not limited in the embodiment of the present disclosure.

Figure 9:
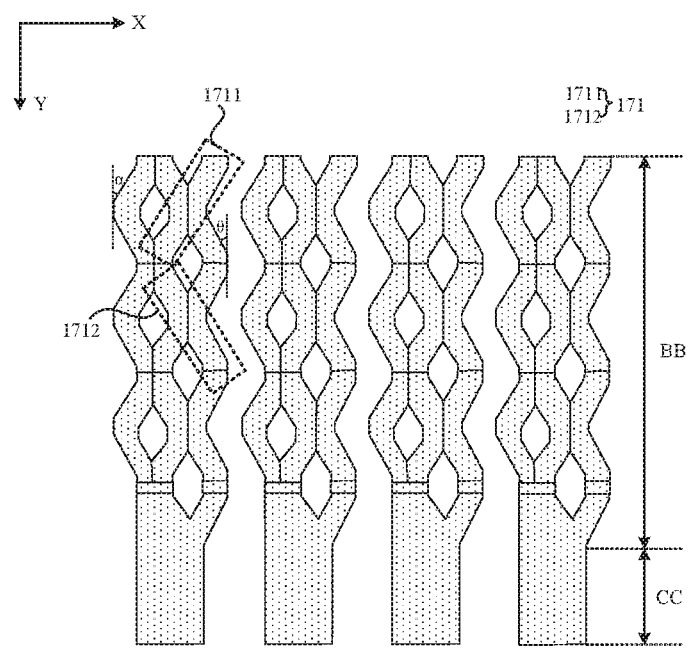
FIG. 9 is a structure diagram of a data signal wire according to an embodiment of the present disclosure.

As a feasible implementation manner, FIG. 9 is a structure diagram of a data signal wire provided by an embodiment of the present disclosure. As shown in FIG. 9, the bending area BB is provided with multiple signal wires 17, and the signal wires 17 include data signal wires 171. Each data signal wire 171 includes a metal mesh data signal wire, the first data wire subsection 1711 and the second data wire subsection 1712 that are cross-connected; an angle α is formed between the extension direction of the first data wire subsection 1711 and the second direction (the direction Y as shown in the figure), and an angle θ is formed between the extension direction of the second data wire subsection 1712 and the second direction, where α≤30°, θ≤30°.

Exemplarily, as shown in FIG. 9, the data signal wire 171 located in the bending area BB include metal mesh data signal wires, for example, the "staggered-8" metal mesh data signal wires as shown in FIG. 9, in this way, the performance of bending durability of the data signal wire 171 can be increased. Even if the first data wire subsection 1711 breaks during the bending process, the second data wire subsection 1712 may also be used for data signal transmission, which increases the reliability of data signal transmission via the data signal wire 171.

Furthermore, by setting the angle α between the extension direction of the first data wire subsection 1711 and the second direction (the Direction Y as shown in the figure) to satisfy α≤30°, and setting the angle θ between the extension direction of the second data wire subsection 1712 and the second direction to satisfy θ≤30°, it is ensured that the distance between the first data line subsection 1711 and the second data line subsection 1712 in the first direction (the direction X as shown in the figure) is small, which is beneficial to realizing the compression of the bending area BB and achieve display of the display panel with a larger rounded corner.

It should be noted that the embodiment of the present disclosure does not limit the specific value of the angle α between the extension direction of the first data wire subsection 1711 and the second direction (the direction Y as shown in the figure), for example, the angle α may be 10°, 15°, 20° or other values; the specific value of the angle θ between the extension direction of the second data wire subsection 1712 and the second direction is not limited, for example, the angle θ may be 10°, 15°, 20° or other values, it is only necessary to ensure that the performance of bending durability of the data signal wire 171 can be increased while the compression of the bending area BB can be achieved.

Figure 10:
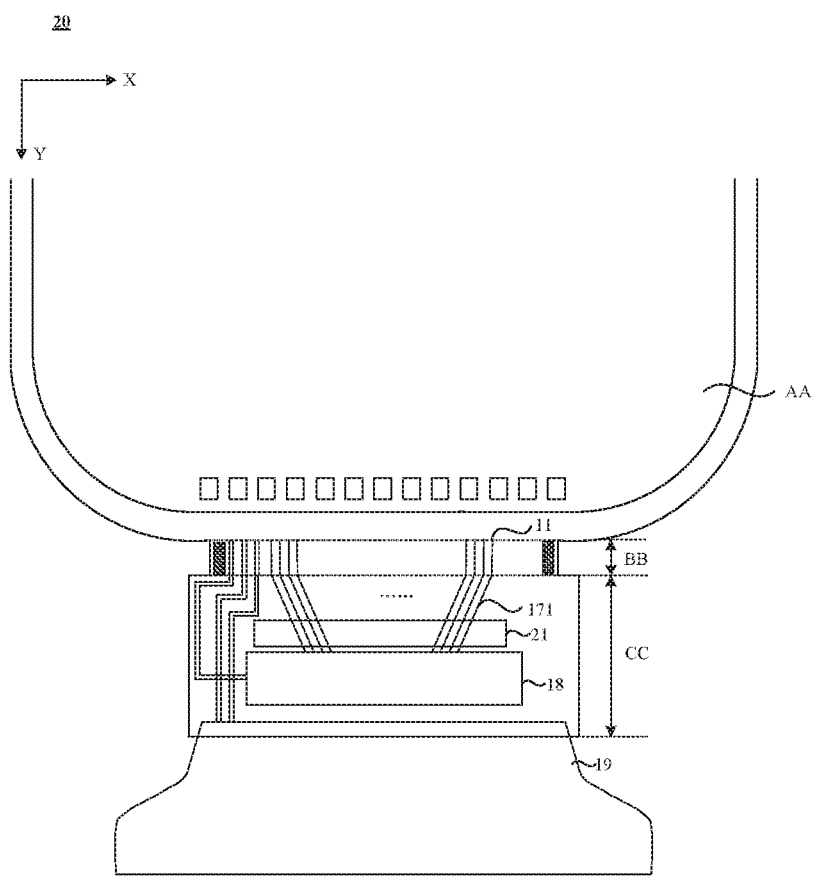
FIG. 10 is a structure diagram of another display panel according to an embodiment of the present disclosure.
Figure 11:
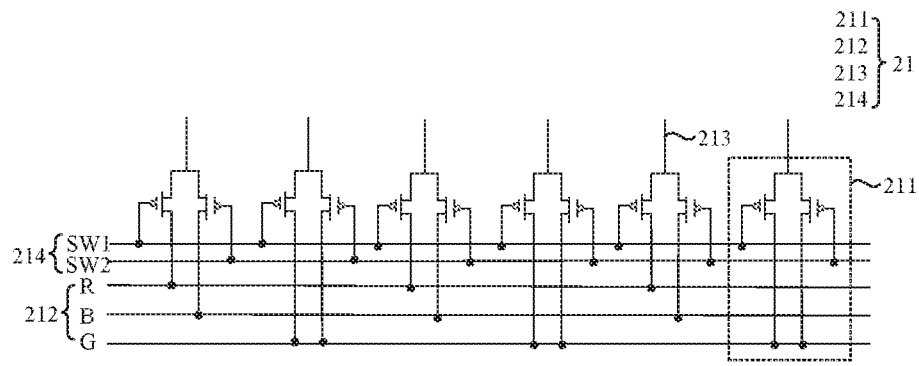
FIG. 11 is a structure diagram of a visual test circuit according to an embodiment of the present disclosure.

As a feasible implementation, FIG. 10 is a structure diagram of another display panel provided by an embodiment of the present disclosure, and FIG. 11 is a structure diagram of a visual test circuit provided by an embodiment of the present disclosure. As shown in FIG. 10 and FIG. 11, the display panel 20 provided by the embodiment of the present disclosure may further include a visual test circuit 21 located in the wiring area CC. The visual test circuit 21 includes multiple second switches 211 and multiple visual test signal input lines 212, multiple visual test signal output lines 213 and multiple visual test control signal lines 214; the visual test signal input line 212 is electrically connected to the first electrode of the second switch 211, and the visual test signal output line 213 is electrically connected to the second electrode of the second switch 212, and the visual test control signal line 214 is electrically connected to the control terminal of the second switch 211.

Exemplarily, as shown in FIG. 10 and FIG. 11, the visual test signal input line 212 and the visual test control signal line 214 are electrically connected to a driving chip 18. In the visual test (VT test) stage, the visual test signal input line 212 receives a visual test signal provided by the driving chip 18, and the visual test control signal line 214 receives the visual test control signal provided by the driving chip 18, the driving chip 18 controls on and off of the second switch 211, and transmits the visual test signal to multiple sub-pixels arranged in the display area AA via the visual test signal input line 212, the second switch 211, and the visual test signal output line 213, and performs VT test about whether the sub-pixels can be displayed normally. In the related art, the visual test circuit 21 is arranged between the bending area BB and the display area AA, and the visual test signal input line 212 and the visual test control signal line 214 are electrically connected to the driving chip 18 located in the wiring area CC after passing through the bending area BB. In the embodiment of the present disclosure, by directly setting the visual test circuit 21 in the wiring area CC, the visual test signal input line 212 and the visual test control signal line 214 do not need to pass through the bending area BB when the visual test signal input line 212 and the visual test control signal line 214 are electrically connected to the driving chip 18. The number of signal wires provided in the bending area BB is reduced, which is beneficial to compression of the bending area BB, and is beneficial to a larger rounded corner display in the display area AA.

Furthermore, when the visual test circuit 21 is arranged in the wiring area CC, the visual test signal output line 213 may multiplex the data signal wire between the wiring area CC and the bending area BB, in this way, the visual test signal output line 213 does not need to enter the display area AA after passing through the bending area BB. The number of signal wires provided in the bending area BB is further reduced, which is beneficial to compression of the bending area BB, and is beneficial to a larger rounded corner display in the display area AA.

Figure 12:
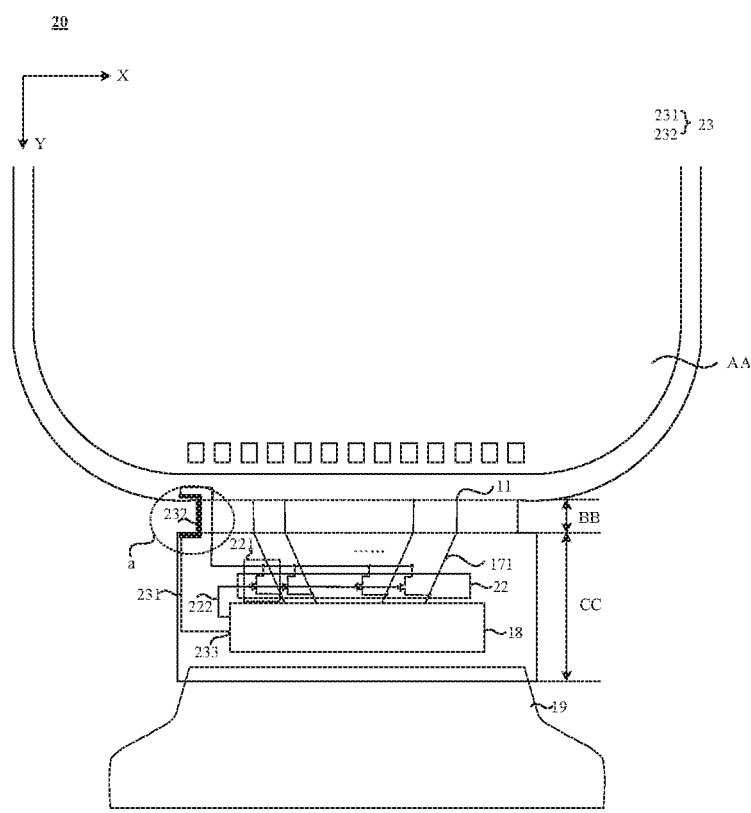
FIG. 12 is a structure diagram of another display panel according to an embodiment of the present disclosure.
Figure 13:
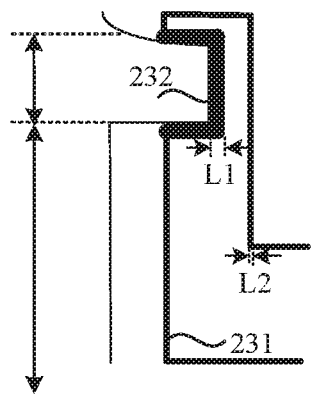
FIG. 13 is an enlarged view of a structure of area a in the display panel shown in FIG. 12.

As a feasible implementation manner, FIG. 12 is a structure diagram of another display panel provided by an embodiment of the present disclosure. As shown in FIG. 12, the display panel 20 provided by the embodiment of the present disclosure may further include a bending area crack detection circuit 22 and a bending area crack detection line 23; the bending area crack detection circuit 22 is located in the wiring area CC, the bending area crack detection line 23 includes a first crack detection subsection 231 and a second crack detection subsection 232 connected to each other; and the second crack detection subsection 232 is located in the bending area BB, and the second crack detection subsection 232 surrounds a connecting corner in the bending area BB, a line width of the second crack detection subsection 232 is L1, a line width of the first crack detection subsection 231 is L2, L1−L2≥2*A, and A represents a process deviation of an alignment preparation between the second crack detection subsection and the connecting corner.

Exemplarily, since cracks may occur in the bending area BB during the bending process, the display panel 20 provided by the embodiment of the present disclosure may further include a bending area crack detection circuit 22 and a bending area crack detection line 23 to realize the detection of cracks in the bending area. Specifically, as shown in FIG. 12, the bending area crack detection line 23 includes a first crack detection subsection 231 and a second crack detection subsection 232 connected to the first crack detection subsection 231, and the second crack detection subsection 232 is located in the bending area BB, and the second crack detection subsection 232 surrounds the connecting corner in the bending area BB, so once the bending area BB has a crack at the connecting corner position, the crack detection line 23 in the bending area can be used to detect the crack at the connecting corner position of the bending area BB to ensure timely and efficient crack detection.

Furthermore, in order to ensure that the second crack detection section 232 can timely and accurately detect the cracks at the connecting corner of the bending area BB, the distance between the second crack detection subsection 232 and the connecting corner of the bending area BB may be set to be small enough. Regardless of the process deviation of the alignment preparation between the second crack detection subsection 232 and the connecting corner, the second crack detection subsection 232 and the connecting corner may be arranged closer to each other, so that once the bending area BB has a crack at a position of the connecting corner, the bending area crack detection line 23 can be used to detect the cracks at the connecting corners of the bending area BB. Taking into account the process deviation of the alignment preparation between the second crack detection subsection 232 and the connecting corner, the line width L1 of the second crack detection subsection 232, the line width L2 of the first crack detection subsection 231, and the process deviation A of the alignment preparation between the second crack subsection section 232 and the connecting corner satisfies L1−L2≥2*A, so as to ensure that the distance between the second detection subsection 232 and the bending area BB is small enough to detect the cracks at the connecting corners of the bending area BB.

On the basis of the above-mentioned embodiment, with continued reference to FIG. 12, the wiring area CC is provided with a crack detection signal output terminal 233, and the bending area crack detection circuit 22 includes multiple first switches 221 and at least one first switch control signal line 222; one end of the bending area crack detection line 23 is electrically connected to an crack detection signal output terminal 233, the other end is electrically connected to the first electrode of the first switch 221, and the control terminal of the first switch 221 is electrically connected to the first switch control signal line 222, and the second electrode of the first switch 221 is connected to the pixel in the display area AA.

Exemplarily, the resistance between the two ends of the crack detection line 23 in the bending area may be detected, so as to detect the crack at the connecting corner of the bending area BB. For example, when the resistance between the two ends of the crack detection line 23 in the bending area is sufficiently large, it can be considered that a crack occurs at the connecting corner of the bending area BB, and the crack extends to the bending area crack detection line 23, and as a result the bending area crack detection line 23 is broken, and the resistance between the two ends of the bending area crack detection line 23 is large enough. Alternatively, it is also possible to output a crack detection signal through the integrated driving chip 18. The crack detection signal is transmitted to the sub-pixels in the display area AA through the bending area crack detection line 23, and by determining whether the sub-pixels emit light normally, it is determined whether crack occurs at the connecting corner of the bending area BB. Specifically, as shown in FIG. 12, the wiring area CC is provided with a crack detection signal output terminal 233. The crack detection signal output terminal 233 may be a signal output terminal on the integrated driving chip 18, and one end of the bending area crack detection line 23 is electrically connected to the crack detection signal output terminal 233. Furthermore, the bending area crack detection circuit 22 includes multiple first switches 221 and at least one first switch control signal line 222, and the other end of the bending area crack detection line 23 is electrically connected to the first electrode of the first switch 221, the second electrode of the first switch 221 is connected to the sub-pixels in the display area AA, so that the crack detection signal can be transmitted to the first switch 221 via the bending area crack detection line 23. When the first switch control signal line 222 controls the first switch 221 to be turned on, the crack detection signal can be transmitted to the sub-pixels in the display area AA through the first switch 221. When the sub-pixels normally emit light, it can be understood that the crack detection signal can be transmitted normally, no crack occurs at the connecting corner of the bending area BB; when the sub-pixels cannot emit light normally, it can be understood that the crack detection signal cannot be transmitted normally, and a crack occurs at the connecting corner of the bending area BB.

Furthermore, with continued reference to FIG. 12, the bending area crack detection circuit 22 is located in the wiring area CC, which ensures that the addition of the crack detection circuit 22 in the bending area will not affect the bending area BB, will not increase the number of signal wires in the bending area BB, and will not increase the extension length of the bending area BB in the first direction, and ensures that a larger rounded corner in the display area AA can be achieved. Furthermore, the second electrode of the second switch 221 can be directly electrically connected to the data signal wire 171 located at the wiring area CC, so that it is not necessary to separately provide a connection wiring between the second electrode of the second switch 221 and the sub-pixel, which ensures that the display panel wiring setting method is simple; at the same time, will not increase the number of signal wires in the bending area BB, and will not increase the extension length of the bending area BB in the first direction, and ensures that a larger rounded corner in the display area AA can be achieved.

Figure 14:
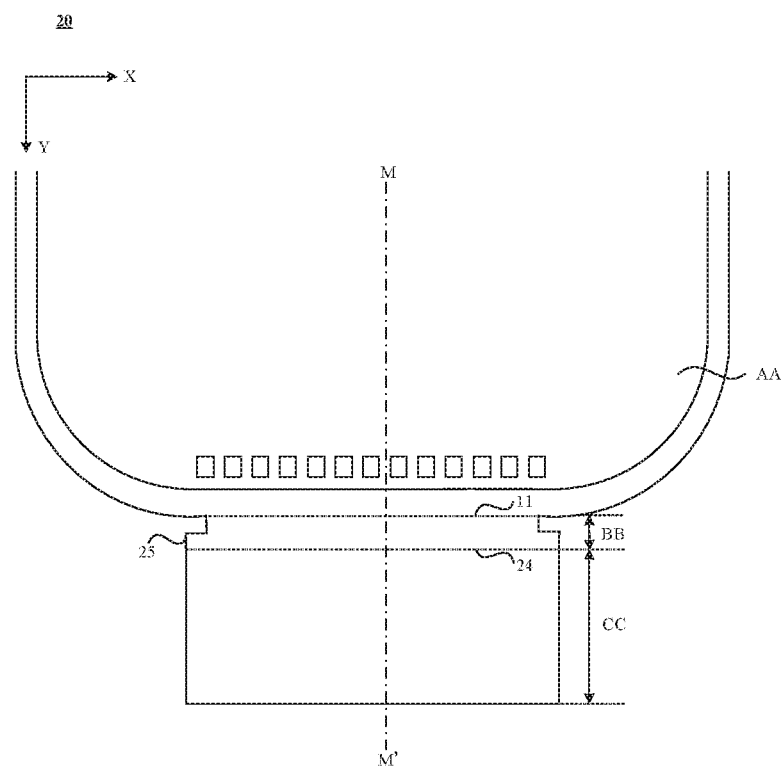
FIG. 14 is a structure diagram of another display panel according to an embodiment of the present disclosure.

As a feasible implementation manner, FIG. 14 is a structure diagram of another display panel provided by an embodiment of the present disclosure. As shown in FIG. 2 and FIG. 14, the bending area BB also includes a second boundary 24 closer to the wiring area CC; in the first direction (direction X as shown in the figure), the extension length of the second boundary 24 is greater than or equal to the extension length of the first boundary 11; in the second direction (direction Y as shown in the figure), the vertical projection of the second boundary 24 on the wiring area CC is within the coverage of the wiring area CC.

Exemplarily, FIG. 2 illustrates an example in which the extension length of the second boundary 24 is equal to the extension length of the first boundary 11 in the first direction (the direction X as shown in the figure), and FIG. 14 illustrates an example in which the extension length of the second boundary 24 is greater than the extension length of the first boundary 11 in the first direction (the direction X as shown in the figure). It can be understood that in order to achieve a larger rounded corner in the display area AA, only the extension length of the first boundary 11 of the bending area BB closer to the display area AA may be limited, the extension length of the second boundary 24 of the bending area BB closer to the wiring area CC may not be limited, and the extension length of the second boundary 24 may be equal to or greater than the extension length of the first boundary 11, which are not limited in the embodiment of the present disclosure.

On the basis of the above-mentioned embodiment, with continued reference to FIG. 14, the bending area BB also includes a side edge 25 connecting the first boundary 11 and the second boundary 24, when in the first direction (the direction X as shown in the figure), when the extension length of the second boundary 24 is greater than the extension length of the first boundary 11, the side edge 25 is a bevel edge or at least one step is formed on the side edge 25.

Exemplarily, the side edge 25 may be a bevel edge (not shown), or at least one step may be formed on the side edge 25 (as shown in FIG. 14). The embodiment of the present disclosure does not limit the specific arrangement of the side edge 25. It should be noted that in order to enhance the performance of bending durability of the bending area BB, when the side edge 25 is a bevel edge, the connecting corner of the bending area BB may be an arc-shaped corner (not shown); when at least one step is formed on the side edge 25, the connecting corners and step corners of the bending area BB may be curved corners (not shown) to avoid stress concentration at the connecting corners or step corners, and to ensure the bending area BB has good performance of bending durability.

Figure 15:
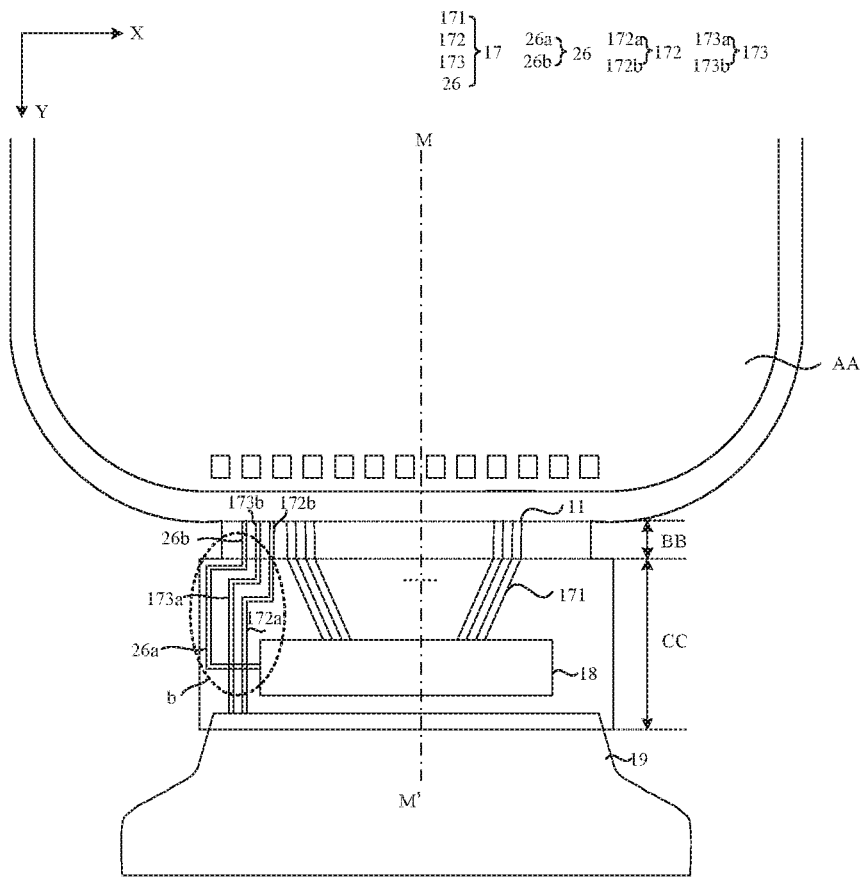
FIG. 15 is a structure diagram of another display panel according to an embodiment of the present disclosure.
Figure 16:
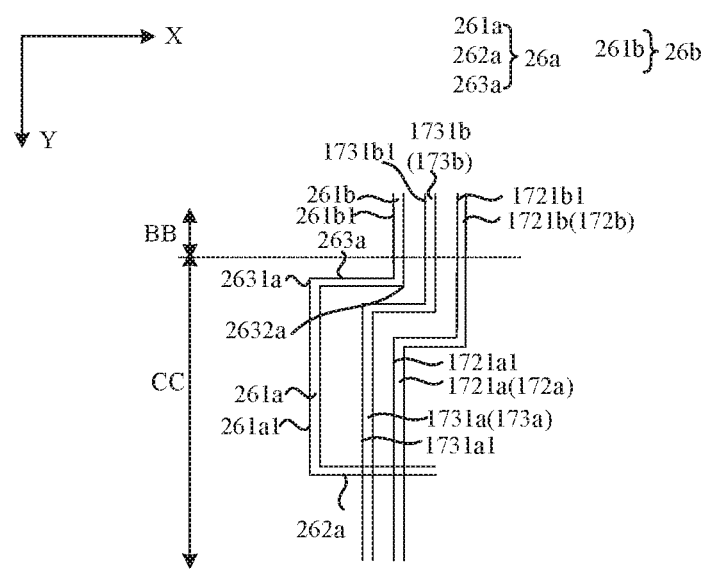
FIG. 16 is an enlarged view of a structure of area b in the display panel shown in FIG. 15.
Figure 17:
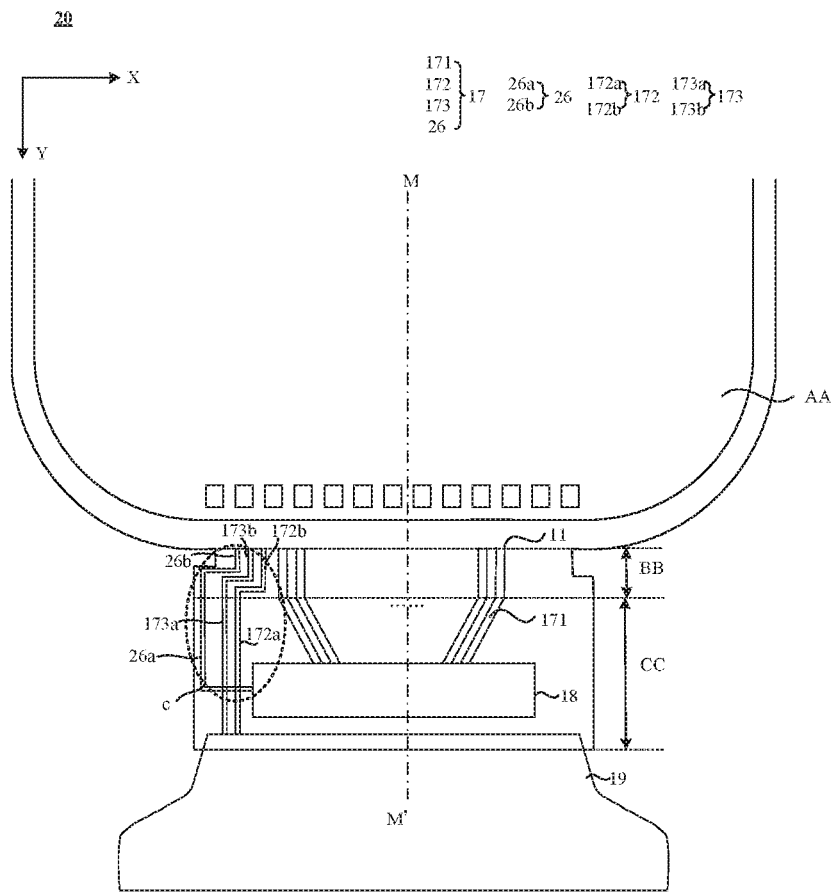
FIG. 17 is a structure diagram of another display panel according to an embodiment of the present disclosure.
Figure 18:
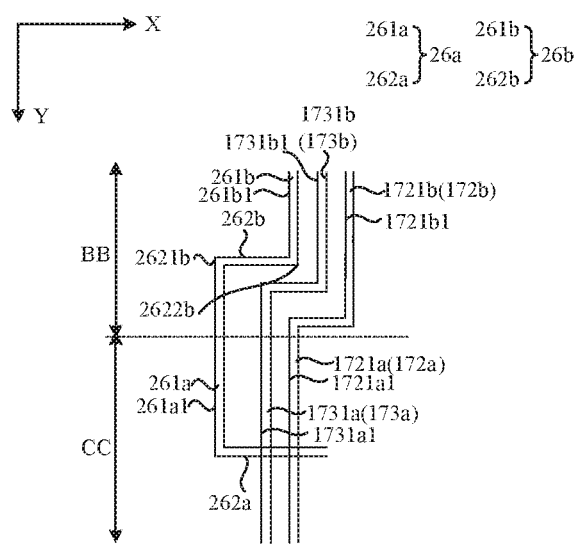
FIG. 18 is an enlarged view of a structure of area c in the display panel shown in FIG. 17.

As a feasible implementation, FIG. 15 is a structure diagram of another display panel provided by an embodiment of the present disclosure, FIG. 16 is an enlarged view of a structure of area b in the display panel provided in FIG. 15, and FIG. 17 is a structure diagram of another display panel provided by an embodiment of the present disclosure, FIG. 18 is an enlarged view of a structure of area c in the display panel shown in FIG. 17. As shown in FIG. 15, FIG. 16, FIG. 17 and FIG. 18, the wiring area CC includes an integrated driving circuit 18, a flexible circuit board 19, a first scan control signal transmission section 26a connected to the integrated driving circuit 18, a first high voltage power signal transmission section 172a and a first low voltage power signal transmission section 173a connected to the flexible circuit board 19; the bending area BB includes a second scan control signal transmission section 26b, a second high voltage power signal transmission section 172b, and a second low voltage power signal transmission section 173b; the first scan control signal transmission section 26a includes at least a first transmission section 261a, and the second scan control signal transmission section 26b includes at least a second transmission section 261b, the first transmission section 261a and the second transmission section 261b both extend in the second direction (the direction Y as shown in the figure); the first transmission section 261a includes a first edge 261a1 facing away from the center M-M' of the display panel, and the second transmission section 261b includes a second edge 261b1 facing away from the center M-M' of the display panel, and in the first direction (the direction X as shown in the figure), the second side 261b1 is located closer to the center M-M of the display panel; the first high voltage power signal transmission section 172a includes at least a third transmission section 1721a, the second high voltage power signal transmission section 172b includes at least a fourth transmission subsection 1721b, and both the third transmission section 1721a and the fourth transmission subsection 1721b extend in the second direction; the third transmission subsection 1721a includes a third edge 1721a1 facing away from the center M-M' of the display panel, and the fourth transmission subsection 1721b includes a fourth edge 1721b1 facing away from the center M-M' of the display panel, and in the first direction, the fourth edge 1721b1 is located on a side closer to the center M-M' of the display panel; the first low voltage power signal transmission section 173a includes at least a fifth transmission subsection 1731a, and the second low voltage power signal transmission section 173b includes at least a sixth transmission subsection 1731b, the fifth transmission subsection 1731a and the sixth transmission subsection 1731b both extend in the second direction; the fifth transmission subsection 1731a includes a fifth edge 1731a1 facing away from the center M-M' of the display panel, and the sixth transmission subsection 1731b includes a sixth edge 1731b1 facing away from the center M-M' of the display panel, and in the first direction, the sixth edge 1731b1 is located on a side closer to the center M-M' of the display panel.

Exemplarily, the bending area BB and the wiring area CC are provided with multiple signal wires 17, and the multiple signal wires 17 may include a data signal wire 171, a high voltage power signal line 172, a low voltage power signal line 173 and a scan control signal line 26, the scan control signal line may further include a high voltage scan control signal line, a low voltage scan control signal line, and a scan clock control signal line. The high voltage power signal line 172 includes a first high voltage power signal transmission portion 172a located in the wiring area CC and a second high voltage power signal transmission portion 172b located in the bending area BB; the low voltage power signal line 173 includes a first low voltage power signal transmission portion 173a located in the wiring area CC and a second low voltage power signal transmission portion 173b located in the bending area BB; the scan control signal line 26 includes a first scan control signal transmission portion 26a located in the wiring area CC and a second scan control signal transmission portion 26b located in the bending area BB.

Furthermore, the first scan control signal transmission section 26a includes at least a first transmission subsection 261a, and the second scan control signal transmission section 26b includes at least a second transmission subsection 261b, a first transmission subsection 261a and a second transmission subsection 261b both extend in the second direction; the first transmission subsection 261a includes a first edge 261a1 facing away from the center M-M' of the display panel, and the second transmission subsection 261b includes a second edge facing away from the center M-M' of the display panel, and in the first direction, the second edge 261b1 is located on a side closer to the center M-M' of the display panel, which ensures that the bending area BB has a small extension length in the first direction, and the display area AA can achieve a larger rounded corner. In the same way, the first high voltage power signal transmission section 172a includes at least a third transmission subsection 1721a, and the second high voltage power signal transmission section 172b includes at least a fourth transmission subsection 1721b, the third transmission subsection 1721a and the fourth transmission subsection 1721b both extend in the second direction; the third transmission subsection 1721a includes a third edge 1721a1 facing away from the center M-M' of the display panel, and the fourth transmission subsection 1721b includes a fourth edge 1721b1 facing away from the center M-M' of the display panel, and in the first direction, the fourth edge 1721b1 is located on a side closer to the center M-M' of the display panel, which ensures that the bending area BB has a small extension length in the first direction, and the display area AA can achieve a larger rounded corner. Similarly, the first low voltage power signal transmission section 173a includes at least a fifth transmission subsection 1731a, and the second low voltage power signal transmission section 173b includes at least a sixth transmission subsection 1731b, the fifth transmission subsection 1731a and the sixth transmission subsection both extend in the second direction; the fifth transmission subsection 1731a includes a fifth edge 1731a1 facing away from the center M-M' of the display panel, and the sixth transmission subsection 1731b includes a sixth edge 1731b1 facing away from the center M-M' of the display panel, and in the first direction, the sixth edge 1731b1 is located on a side closer to the center M-M' of the display panel, which ensures that the bending area BB has a small extension length in the first direction, and the display area AA can achieve a larger rounded corner.

On the basis of the above-mentioned embodiment, with continued reference to FIGS. 15 and 16, in the first direction, the extension length of the second boundary 24 is equal to the extension length of the first boundary 11; the first scan control signal transmission section 26a further includes a seventh transmission subsection 262a and an eighth transmission subsection 263a extending in the first direction, the seventh transmission subsection 262a, the first transmission section 261a, and the eighth transmission subsection 263a are connected to each other in turn; the scan control signal second transmission section 26b includes a second transmission portion 261b; in the first direction, the eighth transmission subsection 263a includes a first end 2631a and a second end 2632a, the first end 2631a is connected to the first transmission subsection 261a, the second end 2632a is connected to the second transmission subsection 261b, and the second end 2632a is located on the side closer to the center M-M' of the display panel. By reasonably setting the arrangement of each transmission section in the scan control signal line, under the premise of realizing the normal transmission of the scan control signal, it is ensured that the bending area BB has a small extension length in the first direction, and the display area AA can be realized a larger rounded corner.

It should be noted that the above embodiment only takes the specific arrangement of the scan control signal line as an example to illustrate how to set the scan control signal line to ensure the normal transmission of the scan control signal to achieve a smaller a small extension length of the bending area in the first direction. It is understandable that it is also possible to reasonably set the configuration of each transmission section in the high voltage power signal line and/or low voltage power signal line, under the premise of ensuring the normal transmission of the high voltage power signal and/or the low voltage power signal, it is realized that the bending area has a relatively small extension length in the first direction, which will not be repeated here.

On the basis of the above embodiment, with continued reference to FIGS. 17 and 18, in the first direction, the extension length of the second boundary 24 is greater than the extension length of the first boundary 11; the first scan control signal transmission portion 26a also includes a seventh transmission subsection 262a extending in the first direction, the seventh transmission subsection 262a and the first transmission subsection 261a are connected to each other; the second scan control signal transmission section 26b also includes a ninth transmission subsection 262b extending in the first direction; in the first direction, the ninth transmission subsection 262b includes a third end 2621b and a fourth end 2622b, the third end 2621b is connected to the first transmission subsection 261a, and the fourth end 2622b is connected to the second transmission subsection 261b, and the fourth end 2622b is located on a side closer to the center M-M' of the display panel. By reasonably setting the arrangement of each transmission subsection, under the premise of realizing the normal transmission of the scan control signal, it is ensured that the bending area BB has a small extension length in the first direction, and the display area AA can be realized a larger rounded corner.

It should be noted that the above embodiment only takes the specific arrangement of the scan control signal line as an example to illustrate how to set the scan control signal line to ensure the normal transmission of the scan control signal to achieve a smaller a small extension length of the bending area in the first direction. It is understandable that it is also possible to reasonably set the configuration of each transmission section in the high voltage power signal line and/or low voltage power signal line, under the premise of ensuring the normal transmission of the high voltage power signal and/or the low voltage power signal, it is realized that the bending area has a relatively small extension length in the first direction, which will not be repeated here.

Figure 19:
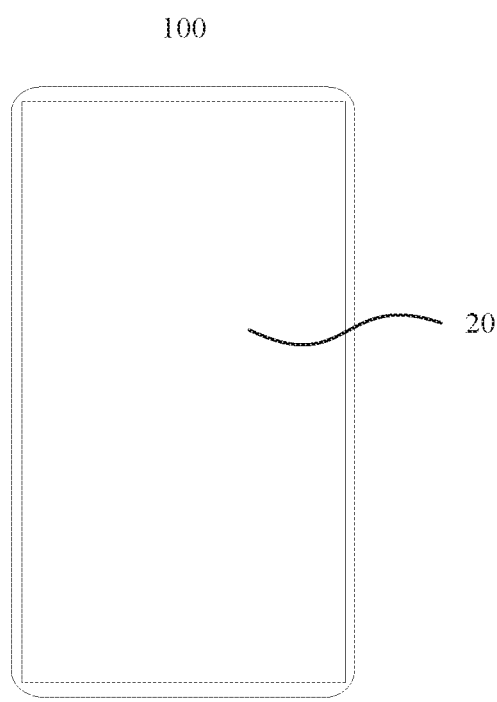
FIG. 19 is a structure diagram of a display device according to an embodiment of the present disclosure.

Based on the same inventive concept, an embodiment of the present disclosure also provides a display device. FIG. 19 is a structure diagram of a display device according to an embodiment of the present disclosure. As shown in FIG. 19, the display device 100 includes the display panel 20 described in any embodiment of the present disclosure. Therefore, the display device 100 provided by the embodiment of the present disclosure has the technical effects of any of the above embodiments, and explanation of the same or corresponding structures and terms as those in the above embodiments will not be repeated here. The display device 100 provided by the embodiment of the present disclosure may be the mobile phone shown in FIG. 19, or any electronic product with a display function, including but not limited to the following categories: TV, notebook computer, desktop display, tablet computer, digital cameras, smart bracelets, smart glasses, on-board displays, medical equipment, industrial control equipment, touch interactive terminals, etc., which are not particularly limited in the embodiments of the present disclosure.

It is to be noted that the above are merely preferred embodiments of the present disclosure and the technical principles used therein. It will be understood by those skilled in the art that the present disclosure is not limited to the specific embodiments described herein. Those skilled in the art can make various apparent modifications, adaptations, combinations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A display panel, comprising a display area, a wiring area, and a bending area connecting the display area and the wiring area;

wherein the bending area comprises a first boundary closer to the display, area;

in a first direction, an extension length of the first boundary is smaller than an extension length of the wiring area; the first direction intersects a direction from the display area to the bending area;

in a second direction, a vertical projection of the first boundary on the wiring area is located within coverage of the wiring area; the second direction is parallel to the direction from the display area to the bending area; and in the second direction, the display area includes a plurality of sub-pixel rows, and a last sub-pixel row of the sub-pixel rows is located on a side of the display area closer to the wiring area; in the first direction, a first sub-pixel in the last sub-pixel row is located on a side of a wiring area boundary closer to a center of the display panel.

2. The display panel of claim 1, wherein the bending area comprises at least a first connecting corner and a second connecting corner connecting the display area and the bending area, and a third connecting corner and a fourth connecting corner connecting the bending area and the wiring area; and
- at least one of the first connecting corner, the second connecting corner, the third connecting corner, or the fourth connecting corner is an arc-shaped corner.

3. The display panel of claim 1, wherein the display panel further comprises at least one anti-tear structure, the at least one anti-tear structure is a metal mesh structure and the at least one anti-tear structure is arranged adjacent to a connecting corner in the bending area; and
- a plurality of signal wires are arranged in the bending area, and the at least one anti-tear structure is arranged in a same layer as the plurality of signal wires.

4. The display panel of claim 1, wherein the display panel further comprises a bending area crack detection circuit and a bending area crack detection line; the bending area crack detection circuit is located in the wiring area, the bending area crack detection line comprises a first crack detection subsection and a second crack detection subsection connected to the first crack detection subsection; and
- the second crack detection subsection is located in the bending area, and the second crack detection subsection surrounds a connecting corner in the bending area, a line width of the second crack detection subsection is L1, a line width of the first crack detection subsection is L2, L1−L2≥2*A, and A represents a process deviation of an alignment preparation between the second crack detection subsection and the connecting corner.

5. The display panel of claim 4, wherein the wiring area is provided with a crack detection signal output terminal, and the bending area crack detection circuit comprises a plurality of first switches and at least one first switch control signal line; and
- an end of the bending area crack detection line is electrically connected to the crack detection signal output terminal, other end is electrically connected to first electrodes of the plurality of first switches, control terminals of the plurality of first switches are electrically connected to the at least one first switch control signal line, and second electrodes of the plurality of first switches are connected to sub-pixels in the display area.

6. The display panel of claim 1, wherein a plurality of signal wires are provided in the bending area, and the plurality of signal wires comprises at least a high voltage power signal line, a low voltage power signal line, a high voltage scanning control signal line and a low voltage scanning control signal line; and
- in a third direction, the high voltage power signal line and the high voltage scanning control signal line at least partially overlap, and the low voltage power signal line and the low voltage scanning control signal line at least partially overlap; the third direction is perpendicular to both the first direction and the second direction.

7. The display panel of claim 1, wherein the display panel further comprises a visual test circuit located in the wiring area, and the visual test circuit comprises a plurality of second switches, a plurality of visual test signal input lines, a plurality of visual test signal output lines and a plurality of visual test control signal lines, the plurality of visual test signal input lines is electrically connected to first electrodes of the plurality of second switches, the plurality of visual test signal output lines is electrically connected to second electrodes of the plurality of second switches, and the plurality of visual test control signal lines is electrically connected to control terminals of the plurality of second switches.

8. The display panel of claim 1, wherein the bending area is provided with a plurality of signal wires, and the plurality of signal wires comprises a plurality of data signal wires, and each of the data signal wires comprises a metal mesh data signal wire, the metal mesh data signal wire comprises a first data wire subsection and a second data wire subsection cross connected to the first data trace subsection; and
- an angle a is formed between an extension direction of the first data wire subsections and the second direction, and an angle θ is formed between an extension direction of the second data trace subsections and the second direction, wherein a<30°, θ<30°.

9. The display panel of claim 1, wherein the bending area further comprises a second boundary closer to the wiring area;
- in the first direction, an extension length of the second boundary is greater than or equal to an extension length of the first boundary; and
- in the second direction, a vertical projection of the second boundary on the wiring area is located within coverage of the wiring area.

10. The display panel of claim 9, wherein the wiring area comprises an integrated driving circuit, a flexible circuit board, a first scan control signal transmission section connected to the integrated driving circuit, and a first high voltage power signal transmission section and a first low voltage power signal transmission section connected to the flexible circuit board separately;
- the bending area comprises a second scan control signal transmission section, a second high voltage power signal transmission section, and a second low voltage power signal transmission section;
- the first scan control signal transmission section comprises at least a first transmission subsection, the second scan control signal transmission section comprises at least a second transmission subsection, and both the first transmission subsection and the second transmission subsection extend in the second direction; the first transmission subsection comprises a first edge of the display panel facing away from a center of the display panel, and the second transmission subsection comprises a second edge of the display panel facing away from the center of the display panel; in the first direction, the second side is located on a side closer to the center of the display panel;
- the first high voltage power signal transmission section comprises at least a third transmission subsection, the second high voltage power signal transmission section comprises at least a fourth transmission subsection, and both the third transmission subsection and the fourth transmission subsection extend in the second direction; the third transmission subsection comprises a third edge of the display panel facing away from the center of the display panel, and the fourth transmission subsection comprises a fourth edge of the display panel facing away from the center of the display panel; in the first direction, the fourth side is located on a side closer to the center of the display panel; and
- the first low voltage power signal transmission section comprises at least a fifth transmission subsection, the second low voltage power signal transmission section comprises at least a sixth transmission subsection, and both the fifth transmission subsection and the sixth transmission subsection extend in the second direction; the fifth transmission subsection comprises a fifth edge of the display panel facing away from the center of the display panel, and the sixth transmission subsection comprises a sixth edge of the display panel facing away from the center of the display panel; in the first direction, the sixth side is located on a side closer to the center of the display panel.

11. The display panel of claim 10, wherein in the first direction, an extension length of the second boundary is equal to an extension length of the first boundary; the first scan control signal transmission section further comprises a seventh transmission subsection and an eighth transmission subsection respectively extending in the first direction, the seventh transmission subsection, the first transmission subsection and the eighth transmission subsection are connected in turn; the second scan control signal transmission section comprises a second transmission subsection; and in the first direction, the eighth transmission subsection comprises a first end and a second end, the first end is connected to the first transmission subsection, and the second end is connected to the second transmission subsection, and the second end is located on a side closer to the center of the display panel.

12. The display panel of claim 10, wherein in the first direction, an extension length of the second boundary is greater than an extension length of the first boundary;

the first scan control signal transmission section further comprises a seventh transmission subsection extending in the first direction, the seventh transmission subsection is connected to the first transmission subsection; the second scan control signal transmission section further comprises a ninth transmission subsection extending in the first direction; and in the first direction, the ninth transmission subsection comprises a third end and a fourth end, the third end is connected to the first transmission subsection, and the fourth end is connected to the second transmission subsection, and the fourth end is located on a side closer to the center of the display panel.

13. The display panel of claim 9, wherein in the first direction, an extension length of the second boundary is greater than an extension length of the first boundary; and the bending area further comprises a side edge connecting the first boundary and the second boundary, the side edge is a bevel edge or at least one step is formed on the side edge.

14. The display panel of claim 1, wherein in the first direction, a first sub-pixel in the last sub-pixel row is located on a side of a bending area boundary closer to the center of the display panel;

or, in the first direction, the first sub-pixel in the last sub-pixel row is located on a side of a wiring area boundary closer to the center of the display panel, and is located on a side of a bending area boundary facing away from the center of the display panel.

15. The display panel of claim 1, wherein the boundary of the display area comprises at least one rounded corner closer to the bending area; and a radius r of the rounded corner satisfies: r>5 mm.

16. A display device, comprising a display panel;

wherein the display panel comprises a display area, a wiring area, and a bending area connecting the display area and the wiring area;

wherein the bending area comprises a first boundary closer to the display area;

in a first direction, an extension length of the first boundary is smaller than an extension length of the wiring area; the first direction intersects a direction from the display area to the bending area;

in a second direction, a vertical projection of the first boundary on the wiring area is located within coverage of the wiring area; the second direction is parallel to the direction from the display area to the bending area; and in the second direction, the display area includes a plurality of sub-pixel rows, and a last sub-pixel row of the sub-pixel rows is located on a side of the display area closer to the wiring area; in the first direction, a first sub-pixel in the last sub-pixel row is located on a side of a wiring area boundary closer to a center of the display panel.

\* \* \* \* \*